United States Patent [19]
von Vajna

[11] Patent Number: 5,773,764
[45] Date of Patent: Jun. 30, 1998

[54] PRINTED CIRCUIT BOARD PANEL

[75] Inventor: Richard P. von Vajna, Fort Worth, Tex.

[73] Assignee: Motorola, Inc., Schaumburg, Ill.

[21] Appl. No.: 697,664

[22] Filed: Aug. 28, 1996

[51] Int. Cl.⁶ .................................................. H05K 1/00
[52] U.S. Cl. ............................ 174/250; 361/748; 29/846
[58] Field of Search ................... 29/846, 840; 324/754, 324/763, 537, 158.1; 361/748, 749; 174/250, 254, 255

[56] References Cited

U.S. PATENT DOCUMENTS

| | | | |
|---|---|---|---|
| 4,366,198 | 12/1982 | Ramspacher, Jr. | 428/43 |
| 4,926,546 | 5/1990 | Polozynski et al. | 29/840 |
| 5,124,633 | 6/1992 | Whitehead et al. | 324/73.1 |
| 5,450,286 | 9/1995 | Jacques et al. | 361/749 |
| 5,461,324 | 10/1995 | Boyette et al. | 324/754 |
| 5,469,064 | 11/1995 | Kerschner et al. | 324/537 |
| 5,629,632 | 5/1997 | Tsutsumi | 324/759 |

*Primary Examiner*—Kristine L. Kincaid
*Assistant Examiner*—Dhiru R. Patel
*Attorney, Agent, or Firm*—Charles W. Bethards

[57] ABSTRACT

A circuit board panel (100) having first and second sides (231, 213) includes opposing score-lines (105, 215) defining a boundary between a first and a second circuit board portions (101, 103), and provide a break line for fragmentation of individual printed circuit boards from the circuit board panel. The circuit board panel includes a pair of electrical test pads (107, 108) which are electrically connected to electrical runners (225, 217). Testing electrical continuity between the test pads (107, 108) reveals the presence or the absence of the score-lines (105, 215).

12 Claims, 4 Drawing Sheets

PRINTED CIRCUIT BOARD PANEL

FIELD OF THE INVENTION

This invention relates in general to printed circuit boards and to a method for their manufacture and testing.

BACKGROUND OF THE INVENTION

A well-known method of testing printed circuit board panels after fabrication and prior to subsequent assembly stages is through the use of automated board testing equipment. While this method seems to be of an advantage for the test of electronic circuits and circuit patterns, this method is normally not useful for the testing of machining processes on printed circuit board panels.

Other testing methods include visual board inspection with enlarged representations from video closed-circuit camera systems, manual inspection by personnel with magnifiers and micrometer measurement devices, non-destructive depth profile testing with laser profilometers, limited destructive testing by analyzing cross sections of printed circuit boards for damage, and non-destructive testing using radiological techniques.

Although some of these methods may be effective in the isolation of defects for limited quality control and assurance, these methods of inspection can be quite costly, time consuming, or equipment intensive. Additionally, manual inspection processes may be less than 100% effective.

For manual singulation of individual printed circuit boards from printed circuit board panels, specially machined score-lines or "break-out" lines are machined into the surfaces of the printed circuit board panels. This facilitates easy and flawless removal of individual circuit boards by manufacturing personnel.

As the use of score-lines has gained popularity in the industry, some problems have been observed, for example; insufficient scoring on the printed circuit board surfaces due to broken bits, miscalibrated scoring machines, score-lines left out or forgotten, score-lines machined too deeply or not deep enough.

Insufficient scoring on printed circuit boards can result in printed circuit boards with fragmented edges, delaminated layers, fault cracks through solder traces, component pads and contact areas, etc. These problems can cause high defect rates in printed circuit boards only to be detected in final manufacturing stages.

Clearly, a need exists for an approach to cost effectively and rapidly test and verify for properly machined score-lines on printed circuit board panels after they are fabricated. This testing and verification should be accomplished prior to the continuation of the assembly process.

A method and apparatus that can minimize defects in printed circuit board panels by isolating improperly machined score-lines on printed circuit board panels is highly desirable.

DETAILED DESCRIPTION OF A PREFERRED EMBODIMENT

The present invention concerns a circuit board panel and a method and apparatus for testing and verifying that a certain sub-process within the fabrication of a printed circuit board panel has been completed.

The printed circuit board panel is preferably a printed circuit board, but could be a thick or thin film hybrid, flexible circuit board or the like. The printed circuit board panel includes substrate material that is preferably a multi-layer printed circuit board fashioned from FR4 laminate with ½ ounce copper layers forming a circuit pattern for interconnecting electronic components affixed thereon. The inventive principles are equally applicable to single or double sided printed circuit board panels and such, which are produced from other materials such as Polyimide, etc. The copper layers are used to produce the circuit patterns which are created with well known subtractive or additive positive or negative photolithographic processes.

The printed circuit board panels (hereinafter referred to as circuit board panels) preferably follow an industry standard method of fabrication including the photolithographic process, the etching process, the laser scanning and test process, the lamination process, and then a machining and finishing process consisting of scoring, drilling, plating, blanking, and routing. It should be noted that the method and apparatus for testing and verifying for the completion of the sub-process may be accomplished prior to, within, or after the machining and finishing processes.

Figure 1:
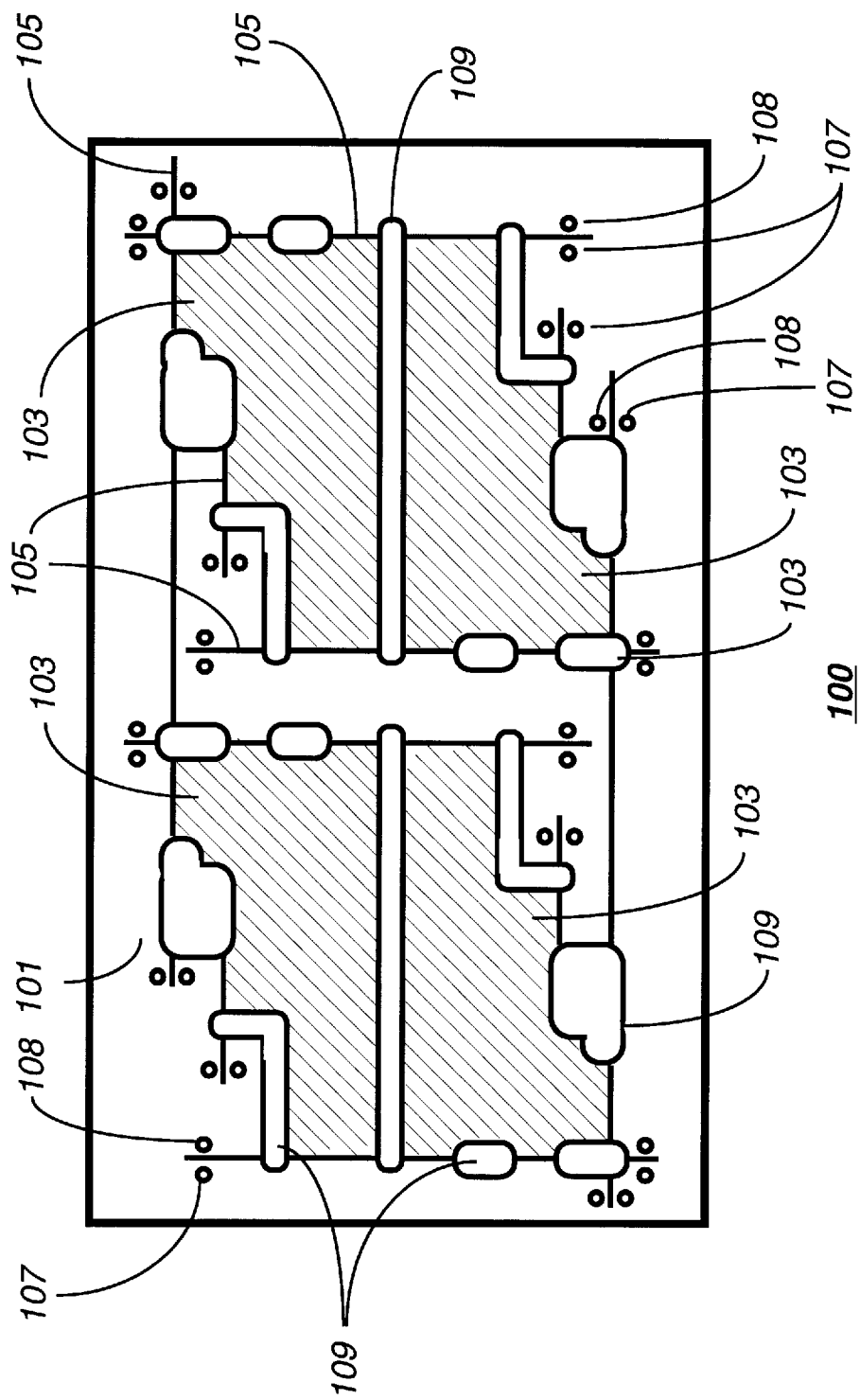
FIG. 1 is a top plan view of a multi-layer printed circuit board panel in accordance with a preferred embodiment of the instant invention.

Referring now to the figures for a more comprehensive explanation of the preferred embodiment in accordance with the instant invention, FIG. 1, depicts a top plan view of a circuit board panel 100. The circuit board panel 100 has circuit board portions 101 and 103. In the preferred embodiment the circuit board portions 103 comprise individual circuit boards while the circuit board portions 101 comprise scrap or selvage. The circuit board panel 100 has a plurality of score-lines 105 formed in a first side, as shown, and opposed score-lines formed in its second side (not shown). The score-lines along with routed areas 109 define boundaries between the circuit board portions 101 and 103. The score-lines provide break-lines for future fragmentation of individual printed circuit boards 103 from the circuit board panel 100. In the preferred embodiment, pairs of electrical test pads 107 and 108 are located on opposite sides of score-lines 105. The electrical test pads may be located adjacent to opposite ends of individual score-lines 105 and also be located at any number of points along the score-line if desired.

Routed areas 109 provide nulls or spaces in the circuit board material which also define a boundary or portion of a boundary between the circuit board portions. These routed areas aid in the singulation of the individual circuit boards 103 from the circuit board panel 100 and provide rounded corners for the finished individual circuit boards 103 after singulation. The score-lines 105 are the only areas where the circuit board material is machined in such a way as to provide for the suspension of the first circuit board portion with the second circuit board portion. In many cases, adjacent score-lines are located at perpendicular angles to enable rigid support for the circuit board portions 103 prior to singulation.

Figure 2:
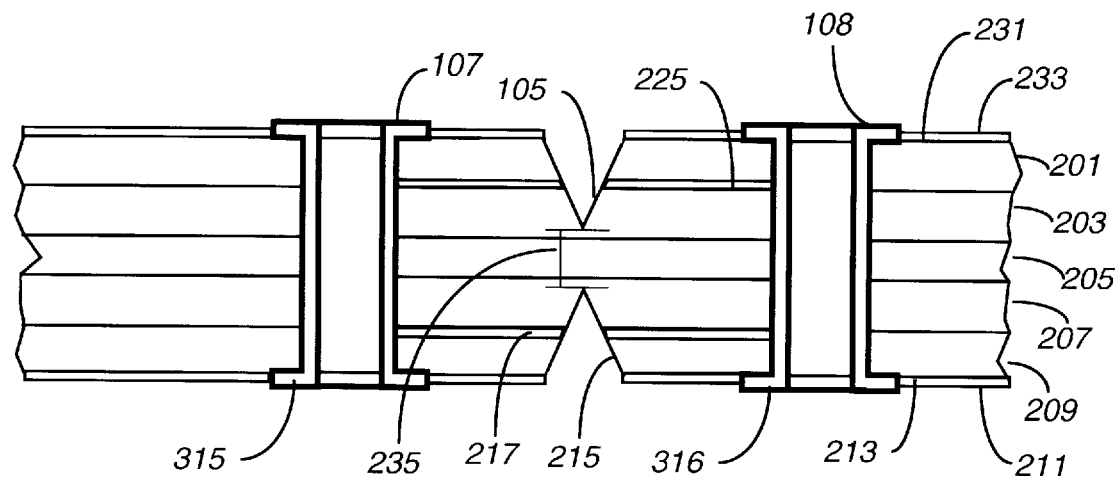
FIG. 2 is a fragmentary cross-sectional drawing of the multi-layer printed circuit board panel of FIG. 1.

Referring to FIG. 2, a fragmentary cross-sectional view of a circuit board panel 100 is shown. The circuit board panel 100 of the preferred embodiment is a multi-layer printed circuit board panel having a plurality of insulating layers 201, 203, 205, 207, and 209. The present invention can be used with circuit board panels having any number of layers. The circuit board panel 100 includes inner layers 203, 205, and 207 and a pair of outer layers 201 and 209. The circuit board panel 100 has a first side 231 and a second side 213. As is conventional, metalization patterns are provided between layers and on the surfaces of circuit board panel 100. During the manufacturing process, a first side score-line 105 is machined through the first sides solder mask 233, the first sides surface 231, the first sides outer layer 201, through the first side's metalized electrical runner 225, and into the inner layer 203. The identical machining process is performed on the second side 213 of the circuit board panel as well, to provide score-line 215.

Figure 3:
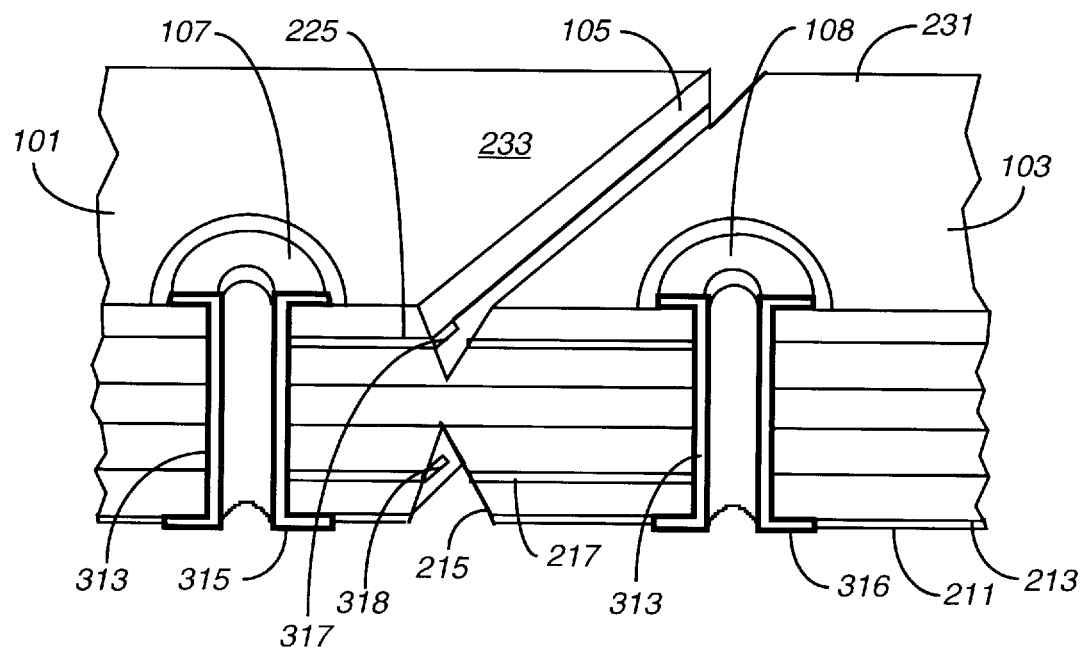
FIG. 3 is a fragmentary isometric drawing depicting a cross-sectional portion of the multi-layer printed circuit board panel of FIG. 1.

Referring to FIG. 3, the circuit board panel 100 includes the score-line 105 machined on the first side 231 which defines a boundary between the circuit board portions 101 and 103. The pair of electrical test pads 107 and 108 on the first side 231 are electrically connected by plated vias or through holes 313 to electrical test pads 315 and 316 on the second side 213. These plated vias 313 are electrically connected by an electrical runner 225 buried within the circuit board panel prior to the forming of scoreline 105. It should be noted that electrical runners may be located on any layer or on either surface of a printed circuit board panel. When the first side 231 is machined with the score-line 105, a discontinuity is formed as a result and the electrical runner 225 is then interrupted at 317.

The circuit board panel 100 also includes a second score-line 215 machined in the second side 213 which similarly defines a boundary between the circuit board portions 101 and 103. The second score-line 215 is directly opposed to the first score-line 105.

The second pair of electrical test pads 315 and 316 located on the second side 213 are electrically connected to a second electrical runner 217 buried within the circuit board panel. When the second side 213 is machined with the second score-line 215, a discontinuity is formed as a result and the electrical runner 217 is interrupted at 318.

Referring again to FIG. 2, it will be understood that a plurality of metalization patterns are disposed on at least some of the plurality of insulating layers 201, 203, 205, 207, and 209. As is well known in the art, the particular metalization patterns are determined by the desired functionality of the circuit board. One of the metalization patterns includes the electrical runner 225. The electrical runner 225 has a discontinuity 317 formed by the opposed side score-lines 215. Another of the metalization patterns includes the pair of test pads 107 and 108, while another metalization pattern includes test pads 315 and 316. The test pads are connected to the electrical runner 225 for providing test points for testing the continuity of the electrical runners. This testing aids in determining the presence of one or either of the opposed side score-lines 105 and 215.

Figure 6:
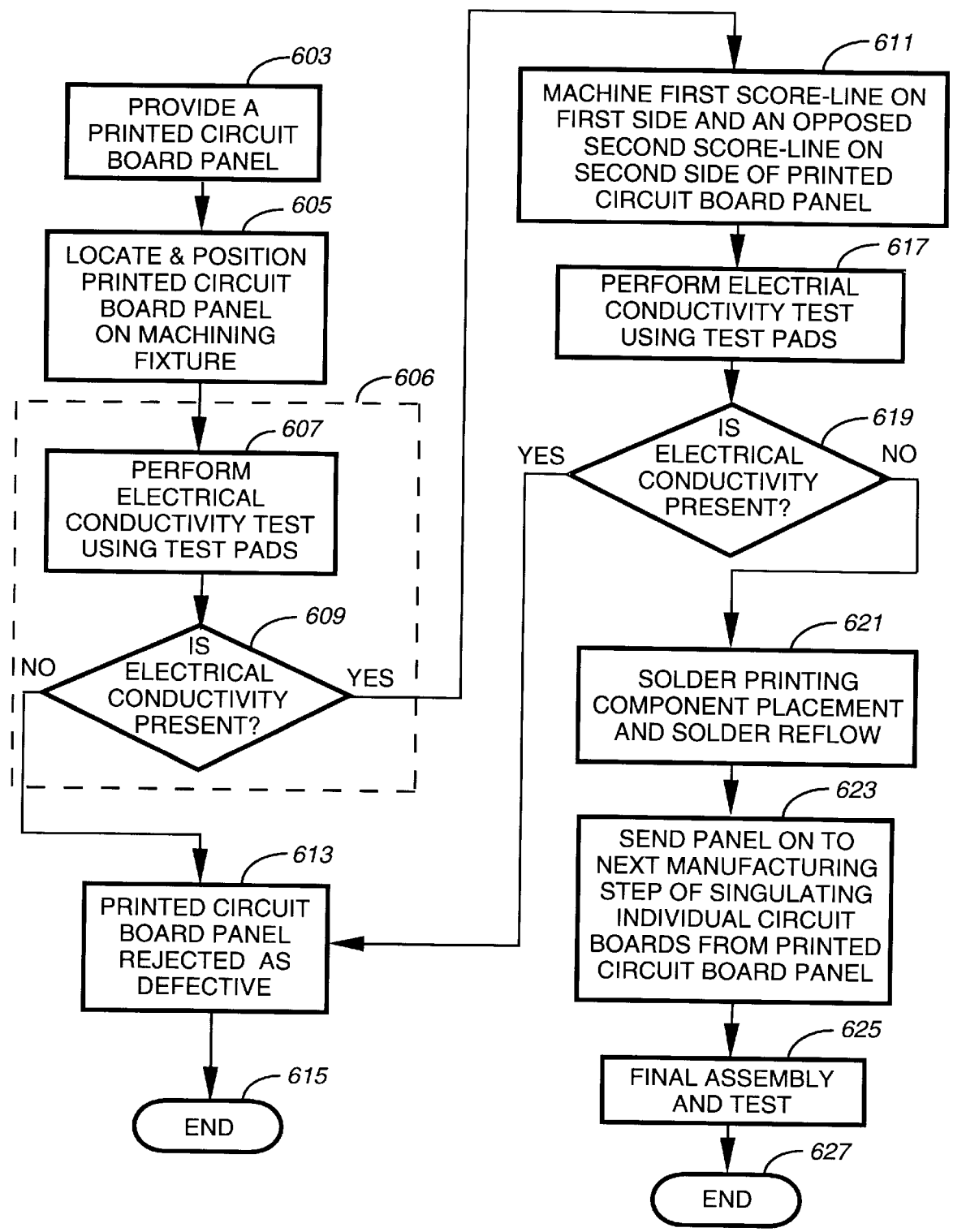
FIG. 6 is a flow chart of the preferred method and an alternate embodiment of the method for the partial fabrication and test of the printed circuit board panel.

Referring to FIG. 6, a method of fabricating and testing a circuit board panel starts at step 603, providing a circuit board panel for subsequent processing. The circuit board panel is a typical multi-layer photolithographic printed circuit board. Each circuit board panel with one or more individual printed circuit boards is located on a machining fixture at step 605.

As an alternate embodiment, process 606, which includes steps 607 through 609, may be used as a "preliminary test routine" to prove early in the process, that the electrical runners are intact before the machining of the score-lines has been accomplished. It is possible that in the early fabrication of the multi-layer printed circuit board panel, particularly, the etching, lamination, and infrared scanning processes, a defect in one of the electrical runners may not have been discovered. This preliminary test would isolate such a defect early in the process prior to machining of the circuit board panel. At the first step 607 of the alternate embodiment, an electrical conductivity test is performed using the test pads provided for testing. It should be noted that this test is performed prior to the machining of the score-lines. The electrical conductivity test (refer to FIG.4 and the description below) may be an automated test using a computer aided machine or simply using a volt-ohm-milliameter and performing a test for electrical continuity by measuring for a short circuit condition.

Figure 4:
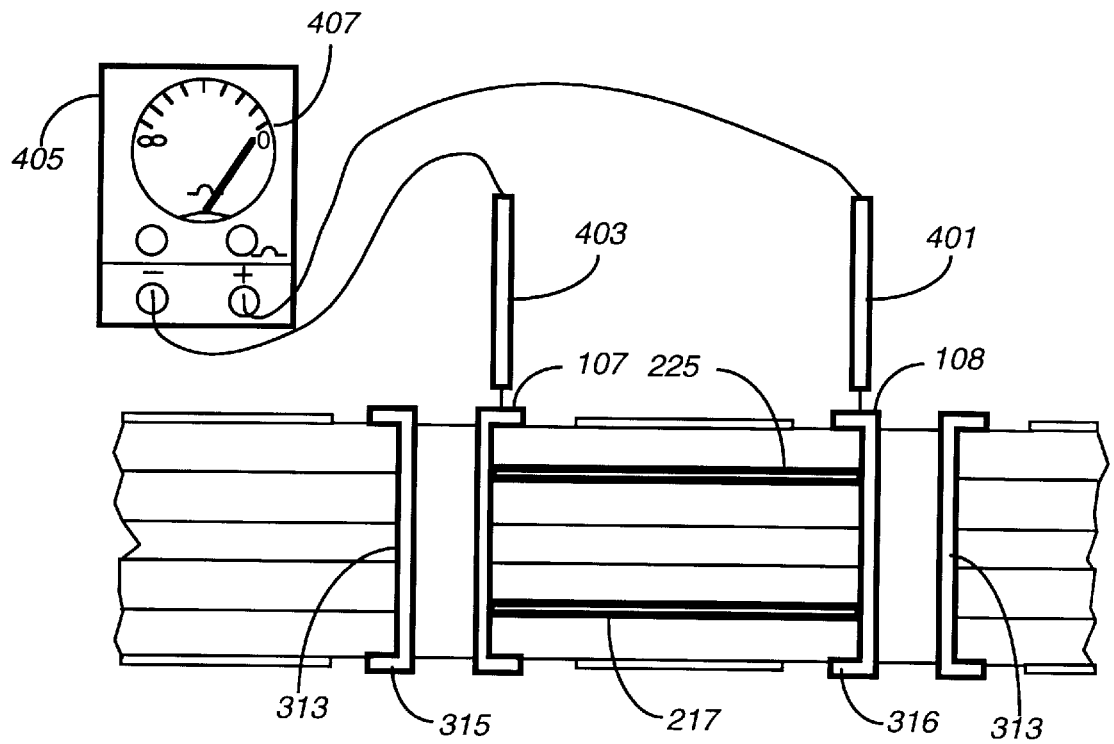
FIG. 4 is a drawing representing a step of testing included in a method for fabricating the multi-layer printed circuit board panel of FIG. 1 in an alternate embodiment.

Referring now to FIG. 4, the printed circuit board panel is illustrated subjected to a test using a common multi-meter 405 and tested for a short circuit condition. The test pads 107 and 108 are physically accessible on the first side and the test pads 315, 316 are physically accessible on the second side of the circuit board panel. As the score-lines have not been machined at this point, the test pads are located preferably on each side of the future locations for the score-lines. The test pads 107 and 108 are interconnected with the plated vias 313 which are electrically connected to the electrical runners 225 and 217 which traverse the future score-line locations. The multi-meter 405 test probes 401 and 403 are positioned to make contact with a test pad 108 and 107 respectively. When electrical contact is made between the test probes and test pads, electrical conductivity should be present. A short circuit condition is indicated by the multi-meter 405 reading 407 when current flow is sensed from one test probe to another.

Referring back to FIG. 6, if electrical conductivity is not present at step 609, the circuit board panel will be rejected as a defective circuit board panel 613 and the process is then ended 615. The process is repeated with steps 601 through 609 with another circuit board panel. If electrical conductivity is present at step 609, the panel is sent on to the next step 611 in the process.

Now referring back to the preferred embodiment, after step 605 the process is continued with step 611 for machining. In this step 611, a first score-line is machined on the first side of the circuit board panel and an opposing second score-line is machined into the second side of the same circuit board panel. Routing of the circuit board panel can also occur at this machining step.

Referring again to FIG. 2, when machined, the score-lines on both sides of the circuit board panel penetrate through the solder mask 233 and 211, the first layers 201 and 209 on each side, and then through the electrical runners corresponding to each side of the panel 225 and 217. The second layers 203 and 207 are partially penetrated, however, the remaining circuit board panel material has a thickness 235 which is preferably approximately 0.012 inches+ or −0.005 inches (0.3+ or −0.13mm).

Referring again to FIG.6, after the printed circuit board panel has been machined with the opposed score-lines, an electrical conductivity test using the test pads is performed at step 617. The step 617 includes the method of testing for electrical conductivity after the machining of the score-lines has been accomplished. (Refer to FIG. 5 and the description below) At step 619, if electrical conductivity is present, the circuit board panel will be rejected as defective 613 and the process is then ended 615 for that circuit board panel.

Figure 5:
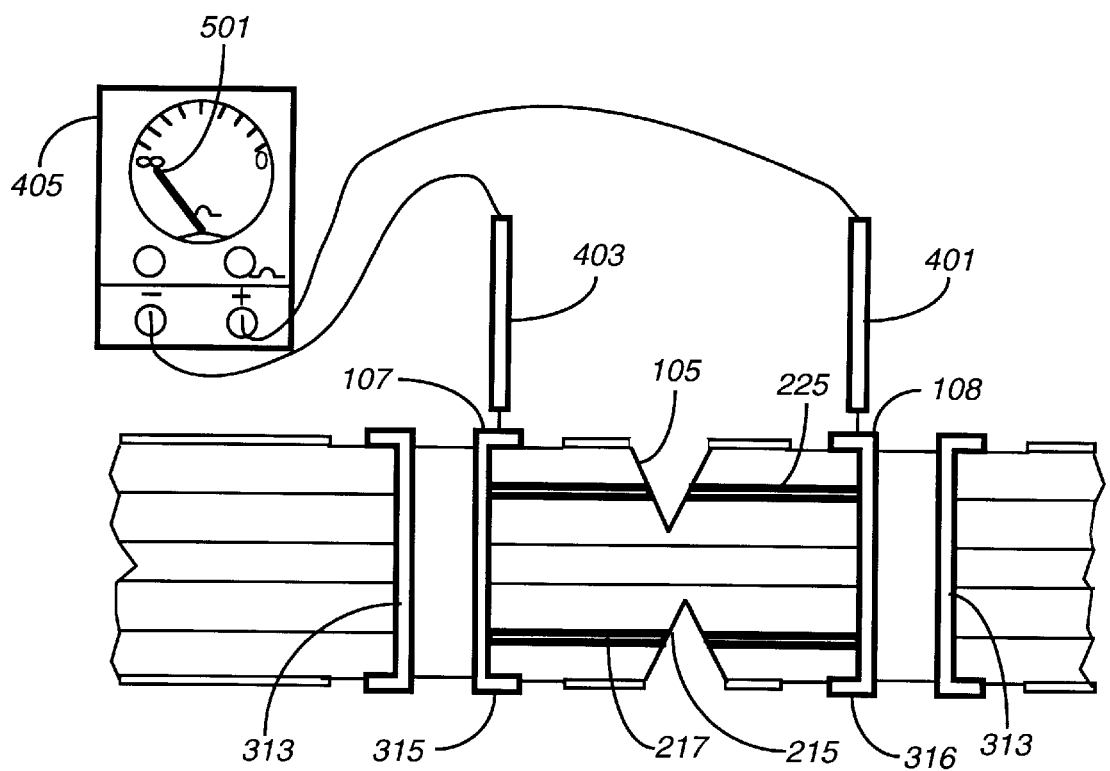
FIG. 5 is a drawing representing a step of testing included in a method for fabricating the multi-layer printed circuit board panel of FIG. 1.

Referring now to FIG. 5, the printed circuit board panel after machining of the first 105 and second 215 score-lines is tested for electrical conductivity as by using a common multi-meter 405 or an automatic test fixture. The testing will be for an open circuit 501 condition. The test pads 107 and 108 are physically accessible on the first side and test pads 315 and 316 are physically accessible on the second side of the circuit board panel. The test pads are located preferably on each side of the score-lines 105 and 215 or on each circuit board portion. The test pads 107 and 108 are connected to the plated vias 313 which, in turn are connected to the electrical runners 225 and 217.

The multi-meter 405 test probes 401 and 403 are positioned to make contact with a test pad 107 and 108. In this test, electrical conductivity should not be present. An open circuit condition 501 is indicated on the multi-meter 405 when current flow is not sensed from one test probe to another.

Referring back to FIG. 6, the process can be repeated with steps 603 through 619 with the following circuit board panel. If electrical conductivity is not present at step 619, the circuit board panel has passed the test and is then routed to the next step 621 in the process, where application of solder paste, component placement, and solder reflow is performed. In some cases, step 621 is performed early on in the fabrication process and would not apply. The next step 623 includes the manual singulation or removal of the individual printed circuit boards from the circuit board panel. After step 623, the individual circuit boards are passed to final assembly and are then tested in step 625. Quality control spot checks may be conducted after this step. The process is then completed at this step 627. Board singulation is accomplished by flexing the circuit board panel along the score-line, which causes the board to snap and break apart at the score-line, as is well known in the art.

It will be appreciated by those of ordinary skill in the art, that the apparatus and methods disclosed provide various approaches for fabricating and testing a printed circuit board panel by identifying improperly machined score-lines to minimize defects in the stages prior to the manufacturing process. This is accomplished without compromising any printed circuit board panel characteristics or otherwise unnecessarily burdening processing resources.

The described inventive methods of fabrication and test may be readily and advantageously employed in automated manufacturing or assembly processes to provide detailed defect identification information for process efficiency and quality.

It will also be apparent to those of ordinary skill in the art that the disclosed invention may be modified in numerous ways and may assume many embodiments other than the preferred forms specifically set out and described above. For example, many of the inventive procedures and apparatus described in a preferred form for manufacturing and testing will work equally as well for other types of printed circuit board production in further stages of manufacturing. Accordingly, it is intended by the appended claims to cover all modifications of the invention which fall within the true spirit and scope of the invention.

What is claimed is:

1. A circuit board panel having first and second sides comprising:
    at least first and second circuit board portions;
    the circuit board panel having a score-line formed in one of its sides defining a boundary between the first and second circuit board portions;
    a pair of electrical test pads, disposed on the circuit board panel; and
    an electrical runner electrically connected to the pair of electrical test pads, the electrical runner being interrupted by the score-line.

2. A circuit board panel as defined in claim 1, in which: the electrical runner is buried within the circuit board panel.

3. A circuit board panel as defined in claim 1, in which: the circuit board panel includes a second score-line on another one of said sides of the circuit board panel opposed to said score line.

4. A circuit board panel as defined in claim 3, having:
    a second electrical runner which is interrupted by the second score-line.

5. A circuit board panel as defined in claim 4, in which: the second electrical runner is electrically connected to the pair of electrical test pads.

6. A circuit board panel as defined in claim 5, in which the second electrical runner is buried within the circuit board panel.

7. A circuit board panel as defined in claim 6, in which: plated vias are electrically connected to the test pads.

8. A circuit board panel as defined in claim 3, further comprising:
    a second pair of electrical test pads, disposed on the circuit board panel; and
    a second electrical runner electrically connected to the second pair of electrical test pads, the second electrical runner being interrupted by the second score-line.

9. A multi-layer printed circuit board panel comprising:
    a plurality of insulating layers, including at least one inner layer and a pair of outer layers, the outer layers having opposed side score-lines for providing a break line for fragmentation of the multi-layer printed circuit board panel;
    a plurality of metalization patterns disposed on at least some of the plurality of insulating layers;
    one of the metalization patterns including an electrical runner, the electrical runner having a discontinuity formed by one of the opposed side score-lines; and
    one of the metalization patterns including a pair of test pads, the test pads being connected to the electrical runner for providing test points for testing the continuity of the electrical runner.

10. A multi-layer printed circuit board panel as defined in claim 9, further comprising:
    one of said plurality of metalization patterns, other than said one of the metalization pattern including an electrical runner, includes a second electrical runner that is electrically connected to the test pads, the second electrical runner having a discontinuity formed by the other of the opposed side score-lines.

11. A multi-layer printed circuit board panel as defined in claim 10, wherein said electrical runner is located between one of the outer layers and said at least one inner layer and said second electrical runner is located between the other of said outer layers and said at least one inner layer.

12. A multi-layer printed circuit board panel as defined in claim 11, wherein said electrical runner and said second electrical runner are connected to said test pads by plated vias.

* * * * *